United States Patent
Aiello et al.

(10) Patent No.: US 10,312,681 B2
(45) Date of Patent: Jun. 4, 2019

(54) AUTOMATIC NETWORK DEVICE ELECTRICAL PHASE IDENTIFICATION

(71) Applicant: Itron, Inc., Liberty Lake, WA (US)

(72) Inventors: Roberto Aiello, Bend, OR (US); Patrick Amihood, San Francisco, CA (US)

(73) Assignee: Itron, Inc., Liberty Lake, WA (US)

( * ) Notice: Subject to any disclaimer, the term of this patent is extended or adjusted under 35 U.S.C. 154(b) by 337 days.

(21) Appl. No.: 15/058,112

(22) Filed: Mar. 1, 2016

(65) Prior Publication Data

US 2016/0352103 A1 Dec. 1, 2016

Related U.S. Application Data

(60) Provisional application No. 62/167,812, filed on May 28, 2015.

(51) Int. Cl.
*H02J 3/12* (2006.01)
*H02J 3/00* (2006.01)
(Continued)

(52) U.S. Cl.
CPC ............ *H02J 3/00* (2013.01); *G01R 19/2513* (2013.01); *G05B 13/0265* (2013.01); *H02J 3/12* (2013.01); *H02J 3/26* (2013.01); *H02J 13/0006* (2013.01); *Y02B 70/3266* (2013.01); *Y04S 20/242* (2013.01)

(58) Field of Classification Search
CPC .................................................... G01R 19/30
See application file for complete search history.

(56) References Cited

U.S. PATENT DOCUMENTS 4,146,841 A 3/1979 McRae
4,532,471 A 7/1985 Hurley
(Continued)

FOREIGN PATENT DOCUMENTS

DE 102008044915 3/2010
DE 102013106393 12/2013
(Continued)

OTHER PUBLICATIONS

Moritz et al., "A CoAP based SOAP Transport Binding", IEEE Conference on Emerging Technologies and Factory Automation (ETFA'2011), Sep. 2011, 4 pages.
(Continued)

*Primary Examiner* — Cheung Lee
(74) *Attorney, Agent, or Firm* — Lee & Hayes, P.C.

(57) ABSTRACT

Techniques detect an electrical phase used by electrical network devices (e.g., a transformer, electrical meter, etc.). Voltage measurement data is obtained, such as from electrical meters. The voltage measurement data may be associated with a timestamp, and may be made at intervals over a period of time. Voltage changes may be calculated using the voltage measurement data. In an example, the voltage change is a difference determined between sequential voltage measurements. In some instances, voltage changes data is removed if it exceeds a threshold. An initial classification of network devices (e.g., randomly or by assumed electrical phase) is determined. A clustering technique (e.g., k-means) is applied, wherein the classification is updated in a manner that segregates the network devices according to actual electrical phase.

17 Claims, 12 Drawing Sheets

(51) Int. Cl.
| | |
|---|---|
| G05B 13/02 | (2006.01) |
| G01R 19/25 | (2006.01) |
| H02J 3/26 | (2006.01) |
| H02J 13/00 | (2006.01) |

(56) References Cited

U.S. PATENT DOCUMENTS

| | | | |
|---|---|---|---|
| 4,930,064 | A | 5/1990 | Tanaka et al. |
| 5,184,119 | A | 2/1993 | Stanbury et al. |
| 5,617,329 | A | 4/1997 | Allison et al. |
| 5,673,196 | A | 9/1997 | Hoffman et al. |
| 5,831,423 | A | 11/1998 | Mancini |
| 5,920,720 | A | 7/1999 | Toutonghi et al. |
| 6,334,050 | B1 | 12/2001 | Skarby |
| 6,456,097 | B1 | 9/2002 | Sutherland |
| 7,272,518 | B2 | 9/2007 | Bickel et al. |
| 7,523,185 | B1 | 4/2009 | Ng et al. |
| 7,583,197 | B2 | 9/2009 | Wesby Van Swaay |
| 7,936,163 | B2 | 5/2011 | Lee, Jr. |
| 8,094,010 | B2 | 1/2012 | Wesby-van Swaay |
| 8,283,911 | B1 | 10/2012 | Bierer |
| 8,301,386 | B1 | 10/2012 | Redmond et al. |
| 8,639,391 | B1 | 1/2014 | Alberth, Jr. et al. |
| 8,797,018 | B2 | 8/2014 | Watkins et al. |
| 9,031,800 | B2 | 5/2015 | Filippenko et al. |
| 9,230,429 | B2 | 1/2016 | McKinley et al. |
| 2005/0063317 | A1 | 3/2005 | Risberg et al. |
| 2005/0177646 | A1 | 8/2005 | Kawano et al. |
| 2006/0071776 | A1 | 4/2006 | White, II et al. |
| 2006/0167981 | A1 | 7/2006 | Bansod et al. |
| 2007/0247331 | A1 | 10/2007 | Angelis et al. |
| 2008/0089390 | A1 | 4/2008 | Picard |
| 2009/0045976 | A1 | 2/2009 | Zoldi et al. |
| 2009/0276170 | A1 | 11/2009 | Bickel |
| 2009/0299660 | A1 | 12/2009 | Winter |
| 2010/0002348 | A1 | 1/2010 | Donolo et al. |
| 2010/0007336 | A1 | 1/2010 | de Buda |
| 2010/0060259 | A1 | 3/2010 | Vaswani et al. |
| 2010/0088431 | A1 | 4/2010 | Oshins et al. |
| 2010/0134089 | A1 | 6/2010 | Uram et al. |
| 2010/0142447 | A1 | 6/2010 | Schlicht et al. |
| 2010/0179704 | A1 | 7/2010 | Ozog |
| 2011/0116387 | A1 | 5/2011 | Beeco et al. |
| 2011/0122798 | A1 | 5/2011 | Hughes et al. |
| 2011/0126176 | A1 | 5/2011 | Kandasamy et al. |
| 2011/0215945 | A1 | 9/2011 | Peleg et al. |
| 2011/0254525 | A1 | 10/2011 | Gaknoki et al. |
| 2012/0041696 | A1 | 2/2012 | Sanderford, Jr. |
| 2012/0062210 | A1 | 3/2012 | Veillette |
| 2012/0117392 | A1 | 5/2012 | Turicchi, Jr. et al. |
| 2012/0126636 | A1 | 5/2012 | Atsumi |
| 2012/0169300 | A1 | 7/2012 | Rouaud et al. |
| 2012/0181974 | A1 | 7/2012 | Kuniyosi et al. |
| 2012/0198037 | A1 | 8/2012 | Shelby et al. |
| 2012/0201195 | A1 | 8/2012 | Rausch et al. |
| 2012/0229089 | A1 | 9/2012 | Bemmel et al. |
| 2013/0024149 | A1 | 1/2013 | Nayar et al. |
| 2013/0035885 | A1 | 2/2013 | Sharon et al. |
| 2013/0076534 | A1 | 3/2013 | Conant et al. |
| 2013/0101003 | A1 | 4/2013 | Vedantham et al. |
| 2013/0110425 | A1 | 5/2013 | Sharma et al. |
| 2013/0241746 | A1 | 9/2013 | Mckinley et al. |
| 2013/0242867 | A1 | 9/2013 | Bell |
| 2013/0275736 | A1 | 10/2013 | Kelley et al. |
| 2013/0278437 | A1 | 10/2013 | Wyk |
| 2013/0335062 | A1 | 12/2013 | de Buda et al. |
| 2014/0005964 | A1 | 1/2014 | Rouaud et al. |
| 2014/0012524 | A1 | 1/2014 | Flammer, III |
| 2014/0032506 | A1 | 1/2014 | Hoey et al. |
| 2014/0039818 | A1 | 2/2014 | Arya et al. |
| 2014/0049109 | A1 | 2/2014 | Kearns et al. |
| 2014/0074670 | A1 | 3/2014 | Garrity et al. |
| 2014/0161114 | A1 | 6/2014 | Shuey |
| 2014/0173600 | A1 | 6/2014 | Ramakrishnan Nair |
| 2014/0214218 | A1 | 7/2014 | Eldridge et al. |
| 2014/0236506 | A1 | 8/2014 | Nikovski et al. |
| 2014/0330955 | A1 | 11/2014 | Bishop et al. |
| 2014/0337429 | A1 | 11/2014 | Asenjo et al. |
| 2014/0358839 | A1 | 12/2014 | Dhurandhar et al. |
| 2014/0379303 | A1 | 12/2014 | Chandrashekaraiah et al. |
| 2015/0052088 | A1 | 2/2015 | Arya et al. |
| 2015/0103672 | A1 | 4/2015 | Stuart |
| 2015/0241482 | A1 | 8/2015 | Sonderegger |
| 2015/0241488 | A1 | 8/2015 | Sonderegger |
| 2015/0280782 | A1 | 10/2015 | Airbinger et al. |
| 2015/0377949 | A1 | 12/2015 | Ramirez |
| 2016/0109491 | A1 | 4/2016 | Kann |
| 2016/0109497 | A1 | 4/2016 | Aiello et al. |
| 2016/0142514 | A1 | 5/2016 | Stuber et al. |
| 2016/0154040 | A1 | 6/2016 | Driscoll et al. |
| 2016/0173237 | A1 | 6/2016 | Braun et al. |
| 2017/0168098 | A1 | 6/2017 | Aiello et al. |
| 2018/0156851 | A1 | 6/2018 | Driscoll et al. |
| 2018/0213304 | A1 | 7/2018 | Van Wyk |

FOREIGN PATENT DOCUMENTS

| | | |
|---|---|---|
| EP | 1460801 | 9/2004 |
| GB | 2426596 | 11/2006 |
| JP | 06273200 | 9/1994 |
| JP | 2000175358 | 6/2000 |
| JP | 2000249730 | 9/2000 |
| JP | 2004340767 | 12/2004 |
| JP | 2012016270 | 1/2012 |
| JP | 2012058233 | 3/2012 |
| JP | 2012521596 | 9/2012 |
| JP | 2014079138 | 5/2014 |
| JP | 2015076994 | 4/2015 |
| JP | 2015107012 | 6/2015 |
| WO | WO2007063180 | 6/2007 |
| WO | WO2009061291 | 5/2009 |
| WO | WO2010105038 | 9/2010 |
| WO | WO2010110787 | 9/2010 |
| WO | WO2014124318 | 8/2014 |

OTHER PUBLICATIONS

Office action for U.S. Appl. No. 14/547,561, dated Jul. 29, 2016, Stuber, "Application Platform Operable on Network Node", 33 pages.

Final Office Action for U.S. Appl. No. 14/280,286, dated Aug. 4, 2016, Robert Sonderegger, "Smart Grid Topology Estimator ", 20 pages.

The PCT Search Report and Written Opinion dated Jul. 7, 2016 for PCT application No. PCT/US2016/030144, 12 pages.

Regehr et al.,"TinyOS 2.1 Adding Threads and Memory Protection to TinyOS", proceedings of the 6th ACM conference on Embedding Network Sensor Systems (SenSys'08), Apr. 2008, 2 pages.

Snell, "Call SOAP Web services with Ajax Part 1: Build the Web services client", IBM Corporation developerWorks, Oct. 2005, 13 pages.

Do, et al., "Open-Source Testing Tools for Smart Grid Communication Network", 2013 IEEE Conference on Open Systems (ICOS), Dec. 2, 2013, pp. 156-161, retrieved on Feb. 7, 2014.

"Health Device Profile", Medical Devices WG, Internet citation, Jun. 26, 2008, pp. 1-44, retrieved from the internet on Nov. 9, 2015 at URL:https://www.bluetooth.org/docman/handlers/DownloadDoc.ashx?doc_id=260864&vid=290095&_ga=1.128761092.961309788.1447059724.

Madden, et al., "TinyDB: An Acquisitional Query Processing System for Sensor Networks", ACM Transactions on Database Systems, vol. 30, No. 1, Mar. 1, 2005, pp. 122-173.

Maqousi, et al., "Towards an Open Architecture for Smart Grid Communications: Possible Pointers from Multiservice Network Research", 2013 1st International Conference & Exhibition on the Applications of Information Technology to Renewable Energy Processes and Systems, IEEE, May 29, 2013, pp. 114-118, retrieved on Aug. 29, 2013.

"Open Smart Grid Protocol (OSGP); draft ETSI GS OSG 001", European Telecommunications Standards Institute (ETSI), France, vol. zArchive—ISG, No. VO.1.2, Nov. 15, 2011, pp. 1-250, retrieved on Nov. 15, 2011.

(56) References Cited

OTHER PUBLICATIONS

The PCT Search Report and Written Opinion dated Mar. 2, 2016 for PCT application No. PCT/US2015/061390, 15 pages.
The Australian Office Action dated Mar. 17, 2017 for Australian Patent Application No. 2015223145, a counterpart foreign application of U.S. Appl. No. 14/280,286, 4 pages.
Berthier et al., "Intrusion detection for advanced metering infrastructures: Requirements and architectural directions", In Smart Grid Communications (SmartGridComm), 2010 First IEEE International Conference on Oct. 4, 2010, pp. 350-355.
Final Office action for U.S. Appl. No. 13/560,078, dated Feb. 24, 2017, Hartman et al., "Automatic Network Topology Detection and Fraud Detection", 33 pages.
Office action for U.S. Appl. No. 14/280,286, dated Mar. 17, 2017, Sonderegger, "Smart Grid Topology Estimator", 13 pages.
The Australian Office Action dated Aug. 23, 2017 for Australian Patent Application No. 2015223053, a counterpart foreign application of U.S. Appl. No. 14/302,617, 10 pages.
The Japanese Office Action dated Aug. 29, 2017 for Japanese Patent Application No. 2016-553886, a counterpart foreign application of U.S. Appl. No. 14/302,617.
The Japanese Office Action dated Sep. 12, 2017 for Japanese patent application No. 2016-553860, a counterpart foreign application of U.S. Appl. No. 14/280,286.
Keisuke Sugiura, Mitsubishi Electric Research Laboratories, Information Processing Society of Japan, 2013, pp 4-513-4-514.
Office action for U.S. Appl. No. 14/280,286, dated Aug. 11, 2017, Sonderegger, "Smart Grid Topology Estimator", 15 pages.
The Canadian Office Action mailed Oct. 26, 2016 for Canadian patent applicatoin No. 2863596, a counterpart foreign application of U.S. Appl. No. 13/560,078, 3 pages.
Office action for U.S. Appl. No. 13/560,078, dated Feb. 24, 2017, Van Wyk, "Automatic Network Topology Detection and Fraud Detection", 32 pages.
Office action for U.S. Appl. No. 14/558,571, dated Mar. 9, 2017, Driscoll, "Electrical Network Topology Determination", 15 pages.
Office Action for U.S. Appl. No. 14/518,564, dated Jul. 20, 2017, Kann, "Grid Topology Mapping With Voltage Data", 18 pages.
Handley, et al., "ComEd Corrects Meter-Transformer Mismatches" ComEd Paper, Sep. 7, 2016, 8 pages.
Extended European Search Report dated Sep. 6, 2012 for European patent application No. 12165026.1, 6 pages.
Hughes, "Augmenting AMI to Radically Reduce Electricity Theft", Metering International, Issue 1, Jan. 1, 2011, pp. 80-83, retrieved from the internet on May 20, 2015 at http://www.metering.com/wp-content/uploads/2013/10/MI-1-2-11.pdf.
Translated Japanese Office Action dated Oct. 28, 2014 for Japanese patent application No. 2014-511377, a counterpart foreign application of U.S. Appl. No. 13/560,078, 5 pages.
Translated Japanese Office Action dated Apr. 22, 2014 for Japanese patent application No. 2014-511377, a counterpart foreign application of U.S. Appl. No. 13/560,078, 6 pages.
Office action for U.S. Appl. No. 13/560,078, dated Oct. 2, 2015, Van Wyk, "Automatic Network Topology Detection and Fraud Detection", 29 pages.
Final Office Action for U.S. Appl. No. 13/560,078, dated Oct. 6, 2014, Hartman Van Wyk, "Automatic Network Topology Detection and Fraud Detection", 34 pages.
Office action for U.S. Appl. No. 13/560,078, dated Dec. 16, 2013, Van Wyk, "Automatic Network Topology Detection and Fraud Detection", 23 pages.
Office Action for U.S. Appl. No. 13/560,078, dated Feb. 13, 2015, Hartman Van Wyk, "Automatic Network Topology Detection and Fraud Detection", 22 pages.
Office action for U.S. Appl. No. 14/280,286, dated Feb. 16, 2016, Sonderegger, "Smart Grid Topology Estimator", 19 pages.
Final Office Action for U.S. Appl. No. 13/560,078, dated Jul. 1, 2015, Hartman Van Wyk, "Automatic Network Topology Detection and Fraud Detection", 23 pages.

Office action for U.S. Appl. No. 13/560,078 , dated Aug. 15, 2013, Van Wyk, "Automatic Network Topology Detection and Fraud Detection", 16 pages.
PCT Search Report and Written Opinion dated Jan. 28, 2016 for PCT application No. PCT/US2015/056482, 10 pages.
PCT Search Report dated Jan. 31, 2013 for PCT application No. PCT/US12/34697, 9 pages.
PCT Search Report and Written Opinion dated Oct. 20, 2015 for PCT Application No. PCT/US15/44191, 11 pages.
PCT Search Report and Written Opinion dated Feb. 18, 2016 for PCT application No. PCT/US20165/063512, 13 page.
PCT Search Report and Written Opinion dated May 22, 2015 for PCT application No. PCT/US2015/017571, 9 pages.
PCT Search Report and Written Opinion dated Jun. 1, 2015 for PCT Application No. PCT/US2015/017575.
Sharon, et al., Topology Identification in Distribution Network with Limited Measurements, Inovative Smart Grid Technology Conference, Jan. 16-20, 2012, IEEE, pp. 1-6.
Short, "Advanced Metering for Phase Identification, Transformer Identification, and Secondary Modeling", IEEE Translation on Smart Grid, IEEE, USA, vol. 4, No. 2, Jun. 1, 2013, pp. 651-658.
Australian Examination Report dated Apr. 28, 2016, for Australian Patent Application No. 2012377368, a counterpart application of U.S. Appl. No. 13/560,078,3 pages.
Australian Office Action dated Jan. 10, 2018 for Australian patent application No. 2015349942, a counterpart foreign application of U.S. Pat. No. 9,781,231, 3 pages.
Australian Office Action dated Jan. 5, 2018 for Australian Patent Application No. 2017202822, a counterpart foreign application of U.S. Appl. No. 13/560,078, 3 pages.
Australian Office Action dated Nov. 24, 2017 for Australian Patent Application No. 2015358521, a counterpart foreign application of U.S. Appl. No. 14/558,571, 3 pages.
Australian Office Action dated Dec. 15, 2017 for Australian Patent Application No. 2015336081, a counterpart foreign application of U.S. Pat. No. 9,568,522, 3 pages.
Australian Office Action dated Feb. 6, 2018 for Australian patent application No. 2015337110, a counterpart foreign application of U.S. Appl. No. 14/518,564, 3 pages.
Communication pursuant to Article 94(3) EPC dated Jul. 29, 2016, for EP Application No. 12165026.1, a counterpart application of U.S. Appl. No. 13/560,078, 6 pages.
Office Action for U.S. Appl. No. 14/302,617, dated Jan. 5, 2018, Sonderegger, "Detection of Electric Power Diversion", 29 pages.
Office Action for U.S. Appl. No. 15/431,473, dated Dec. 29, 2017, Kann, "Electrical Phase Identification", 7 pages.
Office Action for U.S. Appl. No. 14/518,564, dated Dec. 7, 2017, Kann, "Grid Topology Mapping With Voltage Data", 19 pages.
Office action for U.S. Appl. No. 14/280,286, dated Feb. 1, 2018, Sonderegger, "Smart Grid Topology Estimator", 20 pages.
Australian Office Action dated Feb. 26, 2018 for Australian Patent Application No. 2015223145, a counterpart foreign application of U.S. Appl. No. 14/280,286, 3 pages.
Australian Office Action dated May 17, 2018 for Australian Patent Application No. 2017202822, a counterpart foreign application of U.S. Appl. No. 13/560,078, 2 pages.
Australian Office Action dated Jun. 15, 2018 for Australian Patent Application No. 2016266732, a counterpart foreign application of U.S. Appl. No. 15/058,112, 3 pages.
Canadian Office Action dated Feb. 26, 2018 for Canadian patent application No. 2965101, a counterpart foreign application of U.S. Appl. No. 14/518,564, 3 pages.
Canadian Office Action dated Apr. 9, 2018 for Canadian patent application No. 2969685, a counterpart foreign application of U.S. Pat. No. 9,835,662, 4 pages.
Japanese Office Action dated Apr. 24, 2018 for Japanese Patent Application No. 2016-553860, a counterpart foreign application of U.S. Appl. No. 14/280,286.
Japanese Office Action dated Apr. 3, 2018 for Japanese Patent Application No. 2016-553886, a counterpart foreign application of U.S. Appl. No. 14/302,617.
Office Action for U.S. Appl. No. 15/431,473, dated May 14, 2018, Aiello, "Electrical Phase Identification", 7 pages.

(56) References Cited

OTHER PUBLICATIONS

Office action for U.S. Appl. No. 14/280,286, dated Sep. 11, 2018, Sonderegger, "Smart Grid Topology Estimator", 21 pages.
Office Action for U.S. Appl. No. 14/302,617, dated Sep. 18, 2018, Robert Sonderegger, "Detection of Electric Power Diversion", 39 pages.
Australian Office Action dated Oct. 25, 2018 for Australian Patent Application No. 2017202822, a counterpart foreign application of U.S. Pat. No. 9,924,242, 5 pages.
Canadian Office Action dated Oct. 2, 2018, for Canadian patent Application No. 2987580, a couterpart foreign patent application of the U.S. Appl. No. 15/058,112, 9 pages.
European Office Action dated Sep. 17, 2018, for European Patent Application No. 15710639.4, a counterpart foreign application of U.S. Appl. No. 14/302,617, 10 pages.

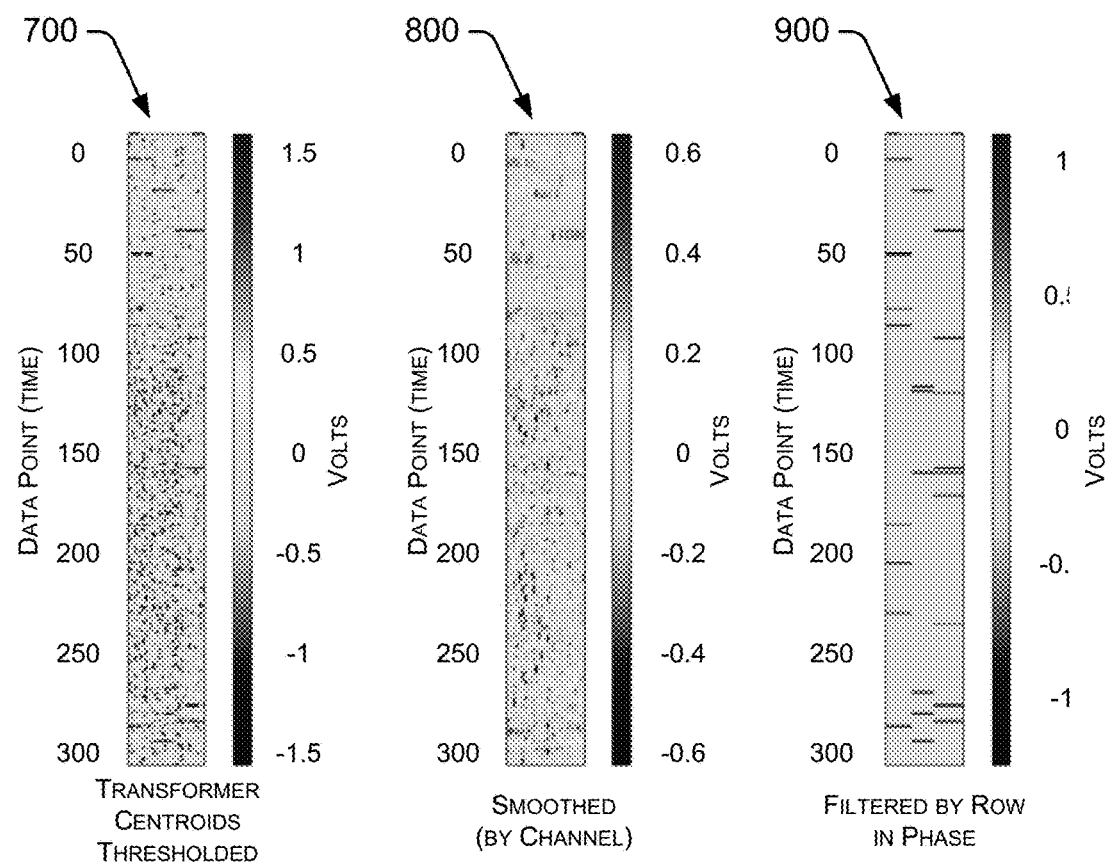

AUTOMATIC NETWORK DEVICE ELECTRICAL PHASE IDENTIFICATION

RELATED APPLICATIONS

This patent application claims priority to U.S. patent application Ser. No. 62/167,812, titled "AUTOMATIC METER TO ELECTRICAL PHASE IDENTIFICATION", filed on May 28, 2015, commonly assigned herewith, and hereby incorporated by reference.

BACKGROUND

Phase identification is a process of discovering and recording the phase, e.g., from among the phases of three-phase electrical power, to which devices in an electrical distribution network are connected. Knowledge of phase use by different customers is important to an electric utility, and assists with functions such as load balancing, power distribution efficiency, smart grid analytics and others. Accordingly, a thorough knowledge of the topology of an electrical network, including knowledge of a phase to which electric meters, transformers and other devices are connected, is important for electrical grid operation.

In many instances, records showing phase use by various network components reflect the original installation of those components. However, over decades of time, some undocumented alterations may have been made by work crews. Accordingly, actual knowledge of the phase used by each component is not necessarily known.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

FIG. 7 is a plot of voltage changes represented by transformer centroids.

FIG. 8 is a plot of the data from FIG. 7 after it has been smoothed over time.

FIG. 9 is a plot illustrating results of filtering the data of FIG. 7 for run lengths of similar data.

DETAILED DESCRIPTION

Overview

Techniques to identify aspects of electrical distribution network topology in an automated manner, including electrical phases used by individual network devices, are presented. In an electrical distribution network, a feeder (the high-voltage wiring from a substation to transformers) may have three conductors, each associated with one of the three phases of electrical power. The feeder may provide power to some transformers using one phase, and provide power to other transformers using different phases, etc. Meters measuring power from transformers are therefore associated with an electrical phase provided by the feeder. However, this relationship may not be adequately documented and/or the documentation may have become outdated.

In one example, an electrical phase used by electrical network devices (e.g., a transformer, electrical meter, etc.) may be determined by looking at voltage changes at a plurality of meters, and applying a clustering algorithm, such as k-means, to that data. To continue a specific example, voltage measurement data is obtained, such as from electrical meters. The voltage measurement data may be associated with a timestamp, and may be made at intervals such as 5 to 60 minutes, over a period such as a couple of days. A particular interval length and/or a particular period of data collection are not required. Voltage changes may be calculated using the voltage measurement data. In an example, the voltage change is a difference determined between sequential voltage measurements. In some instances, voltage change data is removed, excluded and/or ignored if it exceeds a threshold. An initial classification of network devices (e.g., randomly or by assumed electrical phase) is determined. A clustering technique is applied, wherein the classification is updated in an iterative manner that segregates the network devices within the classification according to actual electrical phase. Knowledge of the correct electrical phase to which each network device is attached allows for better power-transmission balance between phases, less infrastructure stress and/or wear, and efficient power transmission.

Example Electrical Distribution Grid

Figure 1:
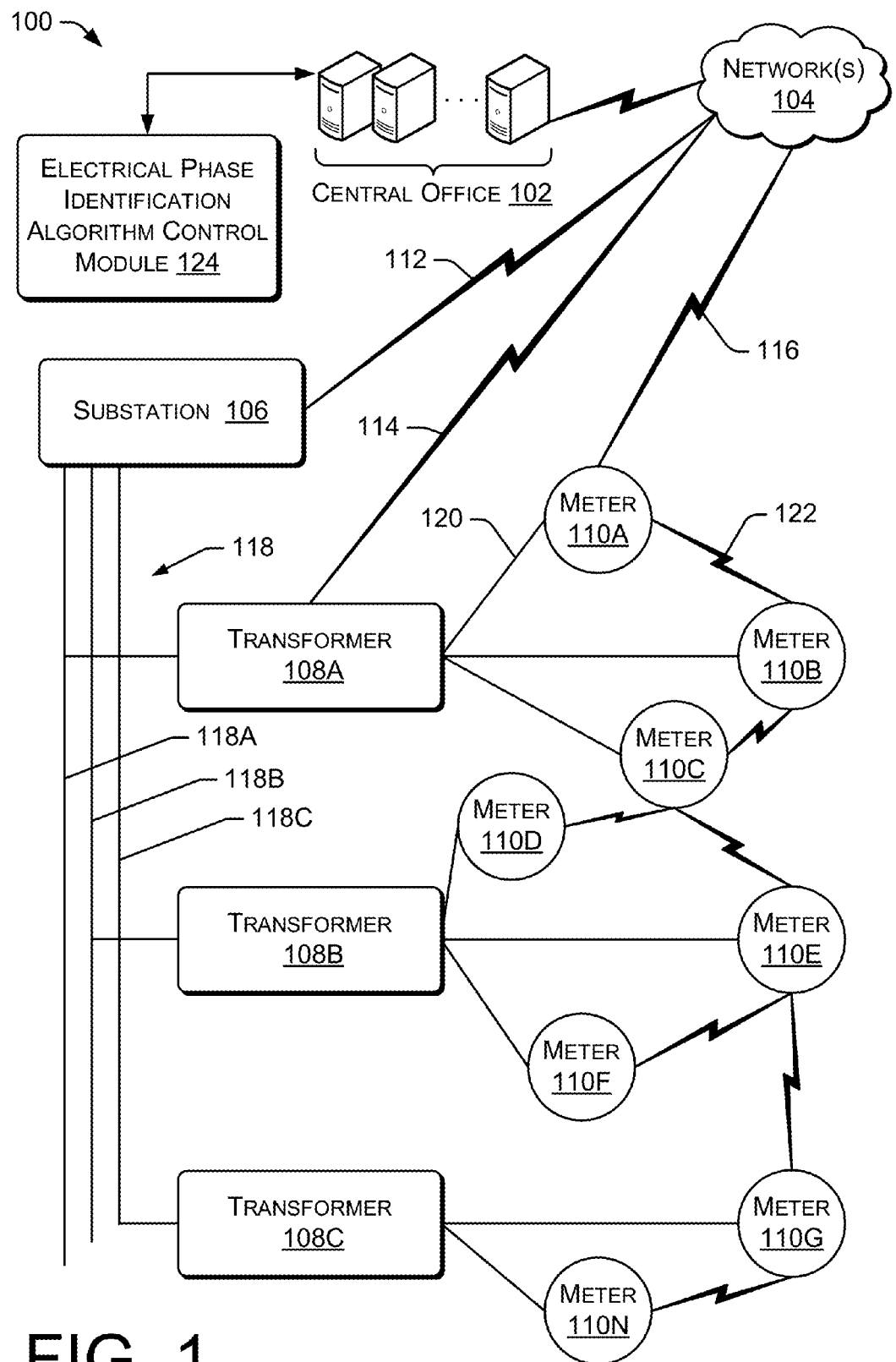
FIG. 1 is schematic diagram showing an example electrical network employing techniques to identify aspects of network topology including electrical phase use by network components.

FIG. 1 shows an example electrical grid or network 100 configured as a smart electrical grid and as an advanced metering infrastructure (AMI). The network 100 may be configured to identify aspects of network topology including an electrical phase used by network components. Identification of the electrical phase that is provided to network components and to network customers allows a utility company run the electrical grid more efficiently. Example improvements include balancing the load on each electrical phase. In the example electrical network 100, a central office 102 may be configured to perform this functionality. In other example networks, the functionality may be distributed among one or more other network device(s), such as meters, transformers, substations, etc.

The central office 102 may include one or more servers or other computing devices, and may be associated with an electrical utility company or a smart grid vendor or provider. The central office 102 may utilize one or more networks 104, such as the Internet or proprietary network(s) and/or connection(s), to communicate with one or more network devices. In the example shown, the central office 102 may communicate with a substation 106, one or more transformers 108 and/or a plurality of meters 110, such as by use of wired or wireless communication links 112, 114 and 116.

The substation 106 may measure and provide power to one or more feeder lines, which in turn provide power to transformers serving other network devices and power consumers/customers. In the example shown, a three-phase transmission line 118 includes phases 118A, 118B and 118C. For purposes of example, the phase lines 118A, B and C each provide power to one transformer, i.e., transformers 108A, 108B and 108C. Each transformer provides power over wiring 120 to each of a plurality of customers (not shown) associated with meters 110. In particular, transformer 108A provides power obtained from phase A and conductor 118A to customers associated with meters 110A, 110B and 110C. Similarly, transformer 108B provides power obtained from phase B and conductor 118B to customers associated with meters 110D, 110E and 110F. Also, transformer 108C provides power obtained from phase C and conductor 118C to customers associated with meters 110G and 110N.

The meters 110 may be connected for communication by a wired or wireless network. The communication may be one- or two-way, and may allow electrical meters 110 to report consumption data to the central office 102. In the example shown, RF links 122 provide a mesh network that allows two-way communication between the central office 102 and meters 110.

An electrical phase identification algorithm control module 124 may be located in the central office 102 or other location. The electrical phase identification algorithm control module 124 may comprise one or more sections of computer executable statements that manage or perform techniques that determine the topology of an electrical grid, particularly with respect to an electrical phase used by network devices (transformers, meters, etc.) and particularly by use of voltage and voltage-change data.

Example Algorithm

Power may be transmitted as three-phase power, with phases A, B and C. A conductor carrying each phase varies its alternating current voltage in a manner that is offset from the other phases by 120 degrees. Techniques to maintain records of the topography of an electrical grid often do not accurately indicate an electrical phase associated with loads/customers, meters, transformers and/or other electrical grid components. Accordingly, solutions to this problem are discussed herein, which allow management of the electrical grid to reduce infrastructure aging, to increase safety and to reduce electrical losses.

In one example of the techniques discussed herein, electric meters that are associated with electrical loads that are on a particular electrical phase will detect many of the same voltage changes at the same time. This may result from connection of such meters to a same conductor supplying the particular power phase. In contrast, meters on different phases, which are connected to different primary supply conductors, may have fewer voltage changes in common.

In a further example, given a plurality of meters associated with a particular same substation, techniques are described herein that cluster those meters into three groups. Each group may be associated with a particular electrical phase. The techniques may utilize voltage changes measured by each meter, and may associate meters that measured similar voltage changes at similar times. The example method and techniques discussed may take advantage of periodic voltage corrections (e.g., daily voltage corrections) done at the substation.

Three high voltage conductors (e.g., feeders) may conduct current associated with the three electrical phases, respectively, between a substation and a plurality of transformers. An example algorithm is presented that will determine the phase used to deliver current to each of the meters. In an example network, there may be N total meters, with $N_A$ meters on Phase A, $N_B$ meters on Phase B, and $N_C$ meters on Phase C. In that case, $N_A+N_B+N_C=N$. Let $m_i$ indicate the $i^{th}$ meter, where $i=1, \ldots, N$. Additionally, let $\bar{v}_i=[v_i^0, \ldots, v_i^{T-1}]$ represent a voltage vector of the $i^{th}$ meter across time, where T equals a set of discrete time samples. Let $\bar{d}_i=[d_i^0, \ldots, d_i^{T-2}]$ be the voltage change (or voltage difference) vector for a meter $m_i$, where $d_i^j=v_i^{j+1}-v_i^j$, $j=0, \ldots, T-2$.

Thus the voltage change or difference vector, $\bar{d}_i$, describes the change in voltage between sequential voltage measurements at an $i^{th}$ network device, such as an electric meter.

Figure 2:
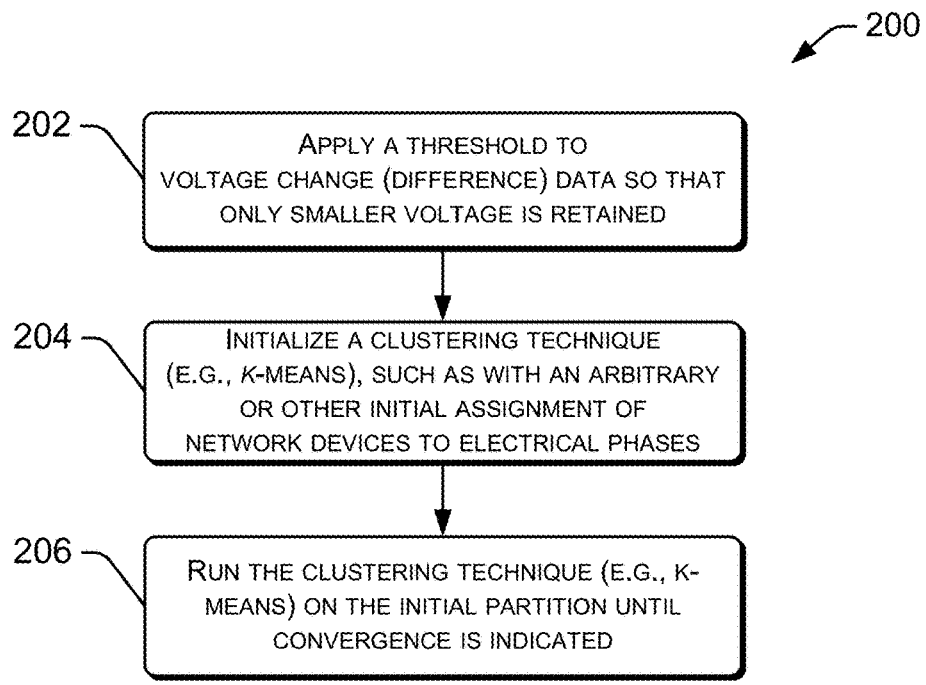
FIG. 2 is a flowchart showing an example implementation of techniques to determine a phase to which network devices are attached.

FIG. 2 shows an example implementation 200 of clustering techniques may be utilized to cluster such vectors according to an electrical phase to which the $i^{th}$ device is attached.

At block 202, a threshold is applied to voltage change data so that only voltage data (or the absolute value of the data) that is smaller than, or within a range of, the threshold is retained. Using the example notation, application of the threshold may be described by:

$$d_i^j := \begin{cases} 0, & |d_i^j| > \gamma \\ d_i^j, & |d_i^j| < \gamma \end{cases},$$

where $\gamma$ is the threshold for all i, j.

In some examples, the threshold $\gamma$ may be discovered empirically, such as by looking at the standard deviation of a histogram (such as the example seen in FIG. 3) of the voltage change values for some or all meters. In some examples, the threshold $\gamma$ may be selected to remove (e.g., set to zero or near zero) one or more data elements in a voltage-change vector associated with a network device (e.g., a meter). Accordingly, the value of the threshold may be dependent on the data set.

At block 204, the clustering algorithm (e.g., a k-means algorithm) may be initialized. In an example, the initialization may provide an arbitrary assignment of voltage change vectors to three clusters, the clusters corresponding to the three phases of electrical power. In a further example, the initialization may be based on best-known, best-records and/or best-guess information.

A utility company may have uncertain information indicating the phase associated with particular network devices, and that information may be used in the initialization of the clustering technique. Such a starting classification may lead to robustness against permutation and choice of a threshold.

Such an initialization may be preferred because the k-means algorithm is less likely to converge at a local minimum if it starts closer to the global optimum.

Alternatively, a random initialization may be utilized. The algorithm is robust against permutations; accordingly, the algorithm works with random assignment of meters or voltage change vectors to the three clusters.

At block 206, the clustering technique (e.g., k-means) may be run on the initial partition until convergence is indicated. In one example, the algorithm converges when phase assignments within the classification no longer change at an iteration. Extending the notation used above, the final classification result may be described as:

$$S_A = \{\overline{d_i} : \|\overline{d_i} - m_A\|^2 \leq \|\overline{d_i} - m_Q\|^2\} \forall Q = B, C$$

$$S_B = \{\overline{d_i} : \|\overline{d_i} - m_B\|^2 \leq \|\overline{d_i} - m_Q\|^2\} \forall Q = A, C$$

$$S_C = \{\overline{d_i} : \|\overline{d_i} - m_C\|^2 \leq \|\overline{d_i} - m_Q\|^2\} \forall Q = A, B$$

where $S_P$ is a set, with P equal to Phase A, B, and C, and $$m_P = \frac{1}{|S_P|} \Sigma_{\overline{d_i} \in S_P} \overline{d_i}$$

is the centroid of the converged cluster for phase P.

Thus, the set $S_A$ contains the voltage change vectors belonging to the meters clustered to Phase A centroid, and so on for sets $S_B$ and $S_C$.

Figure 3:
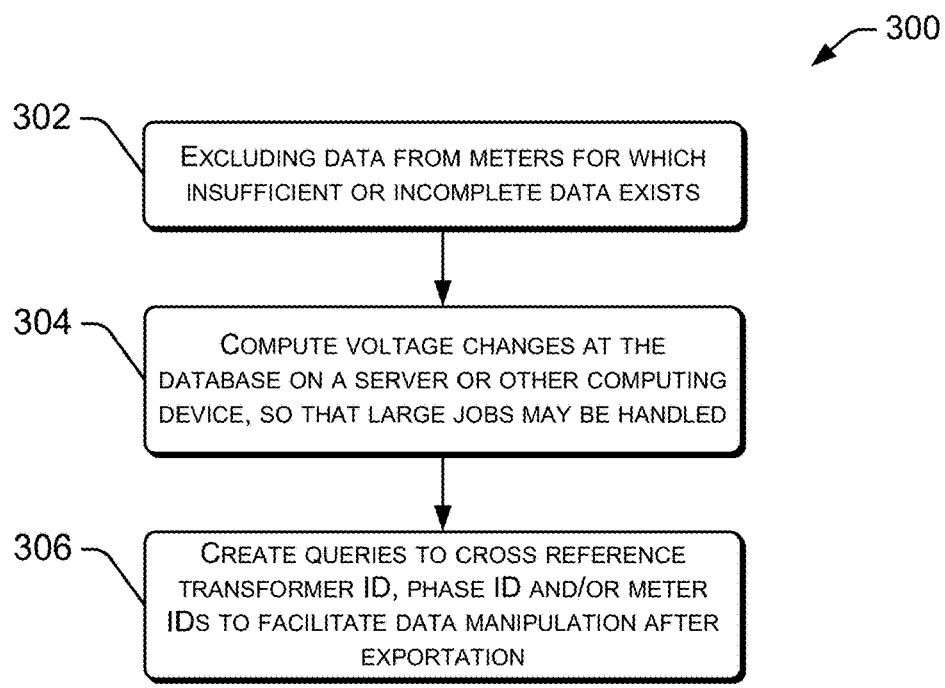
FIG. 3 is a flowchart showing an example implementation of techniques for data cleaning and handling.

FIG. 3 shows example techniques 300 for data cleaning and handling. Data cleaning may include removal of some data that is in some way incomplete. Incomplete data may be missing voltage measurement data associated with certain times or locations. At block 302, data that is incomplete is removed. Such incomplete data may be missing one or more voltage readings, time entries or other data associated with meters. At block 304, voltage changes may be computed at a database on a server, so that large jobs are possible. At block 306, queries may be created to allow cross references between transformer ID, phase ID and/or meter IDs. Such queries may facilitate data manipulation after exportation.

Example Data Analysis Techniques

Some clustering techniques, such as k-means, do not work well with outlier data elements. To remove such outliers, a threshold value may be used, and all data having an absolute value greater than the threshold may be set to zero or near zero, or generally removed.

Figure 4:
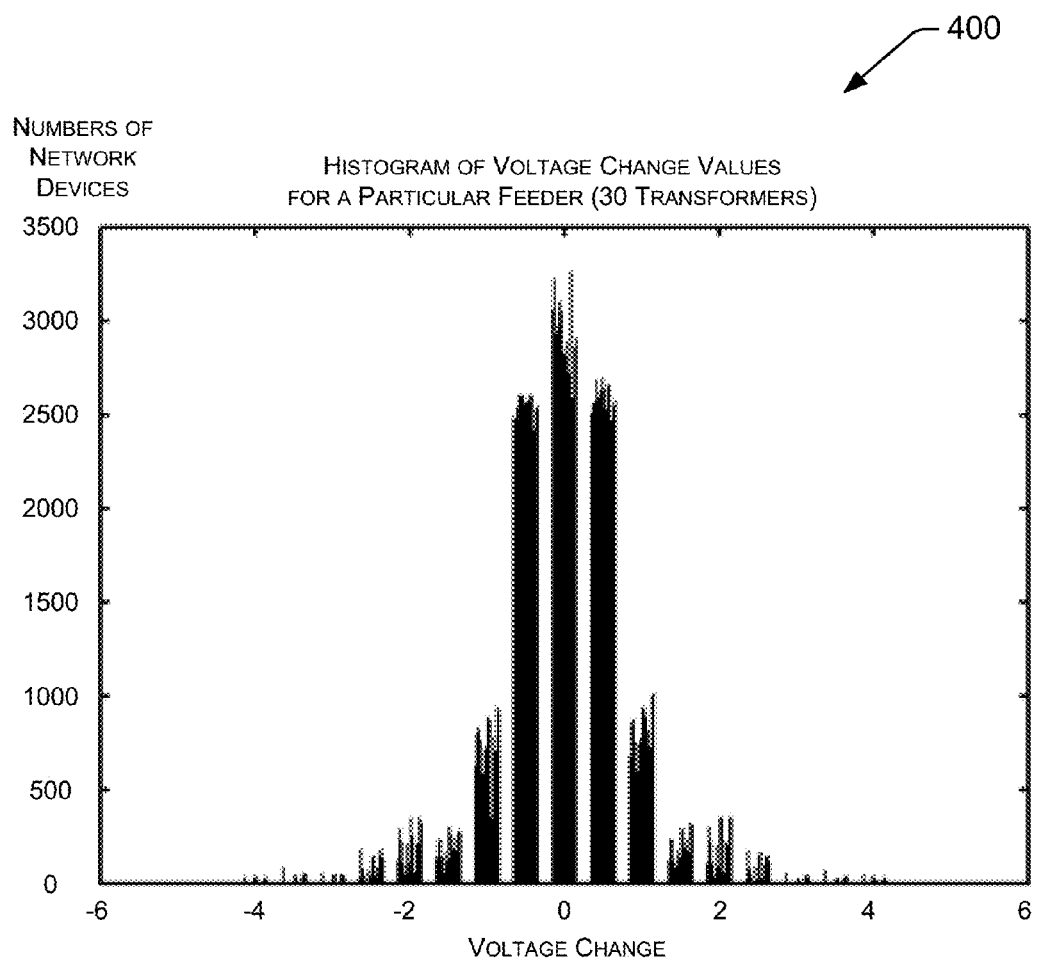
FIG. 4 is a histogram showing how many network devices (e.g., electric meters) experienced each of a plurality of voltage changes between successive measurements.

FIG. 4 shows an example relationship 400 between network devices (e.g., electric meters) and voltage changes that are measured/calculated by those devices. The histogram shows a range of measured voltage values over 8639 samples, measured by meters associated with thirty transformers. In the example relationship 400, removal of voltage changes having an absolute value that is greater than 1.5 volts adequately removes the outlier elements.

Another example involves experimentation with different thresholds to visually reveal common voltage changes. Once a visual representation is available having periodicity that can be confirmed by frequency analysis, the distribution of common voltage changes can be found, to thereby optimize the threshold that is actually to be used. The optimized threshold may be used prior to clustering.

In some examples of data obtained from network devices, use of a threshold may not be necessary. If the data is slowly varying enough (e.g., voltage measurements at 60-minute intervals, rather than 5-minute intervals), the data may have been effectively averaged or low passed filtered to not require application of a threshold.

Example Data Results

Figure 5:
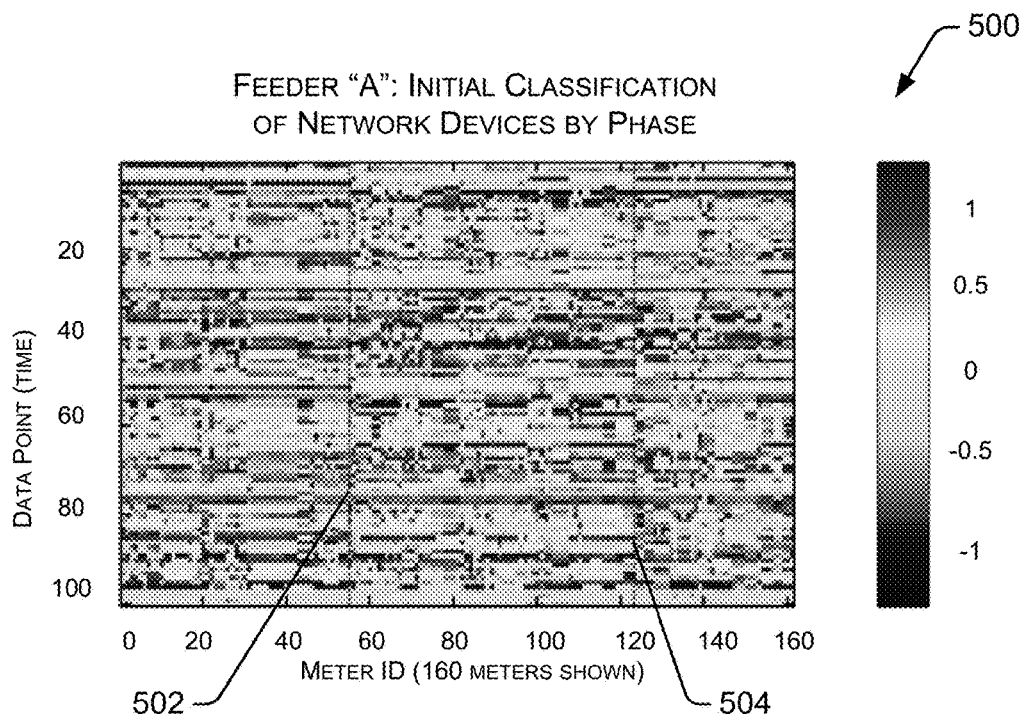
FIG. 5 is a diagram showing an initial classification of electrical phase use by network devices on a particular feeder line.
Figure 6:
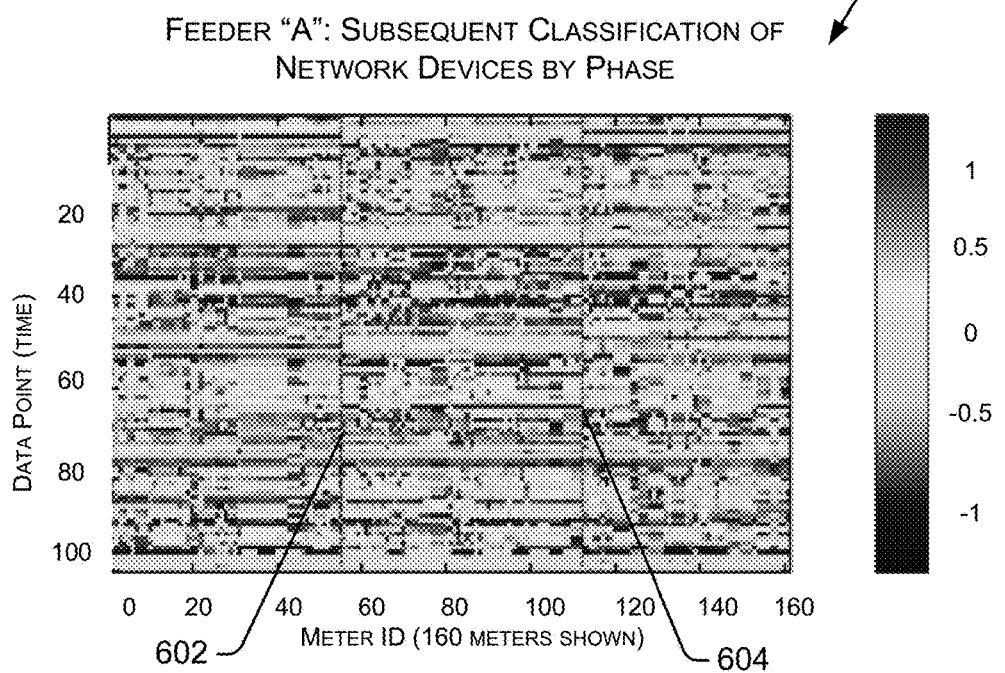
FIG. 6 is a diagram showing a subsequent or final classification of electrical phase after operation of a clustering algorithm.

FIGS. 5 and 6 show example results of application of the techniques discussed herein to 160 meters distributed along an arbitrary feeder "A." FIG. 5 shows an initial understanding 500 of phase connectivity of the network devices, while FIG. 6 shows an understanding 600 of the phase connectivity after operation of the techniques discussed herein. Accordingly, FIG. 5 is "before" and FIG. 6 is "after" operation of the algorithm (e.g., as seen in FIG. 2). The 160 meters are distributed along the horizontal axis. Each meter's data is oriented vertically; accordingly, there are 160 vertical columns distributed about the horizontal axis. Each meter has 100 time samples of voltages and calculated voltage changes, shown on the vertical axis. These voltage changes are indicated by a legend on the right, and range between positive 1 and negative 1. An initial classification of meters according to electrical Phases A, B and C is shown by vertical lines 502, 504 resulting in left, center and right groupings seen in FIG. 5. The classification of FIG. 6 is visibly different than that of FIG. 5. The vertical lines 602, 604 that divide the phases have moved. As a result, the grouping associated with electrical phase C has been enlarged and the grouping associated with phase B has been reduced. Accordingly, the topology of the network is better understood.

In one example of application of the techniques described herein, electrical meters took voltage measurements, voltage changes were calculated, and the algorithm 200 of FIG. 2 was applied to the voltage change data. In the example, approximately 2 days of sampling at a rate of one voltage measurement every five minutes resulted in approximately 500 voltage change values. The data was sufficient for the algorithm 200 to converge.

In a second example of application of algorithm 200, voltage measurements were made every 60 minutes. The data was taken over two days, and included approximately 48 voltage measurements and calculated voltage changes. This data was also sufficient to result in convergence of the algorithm 200.

Example Transformer-Based Algorithm

Results similar to the algorithm 200 may be obtained by an alternative algorithm that is based in part on transformer connectivity. The alternative algorithm may be useful when resources are inadequate to handle data collection and processing from a large number of meters. In a transformer-based algorithm, transformer centroids are computed and transformers are classified into phases. A transformer centroid may be based on an averaging process of voltage values measured by the meters attached to the transformer. Thus, a voltage change vector may be derived for a transformer from voltage change vectors of the several meters associated with the transformer. When the transformers are reclassified into a correct phase, each transformer's meters may also be reclassified into appropriate phases.

Frequency Analysis

The analysis of voltage changes on an electrical phase over time may result in discovery of one or more commonly detected voltage changes that are repeated according to a frequency. In one example, the frequency analysis may be performed using voltage change data obtained from individual electrical meters. Alternatively, the commonly detected voltage changes may be examined at the transformer level by considering transformer centroids to thereby average voltage changes seen at individual meters. The transformer centroids may be created by averaging and/or weighting voltage measurement data of all meters under the same transformer.

FIGS. 7-9 show example data obtained by averaging voltage change data from meters associated with each of a plurality of transformers. Thus, each transformer is associated with voltage change data that results from processing voltage measurement and/or voltage change data of its meters. As with the previously described techniques to associate meters with an appropriate electrical phase, transformers may be associated with an appropriate electrical phase using similar techniques, such as the algorithm 200 of FIG. 2.

FIG. 7 shows a plot 700 of the voltage changes represented by the transformer centroids. A threshold has been applied to the data to thereby limit voltage changes. Each transformer has provided 300 voltage measurements, resulting in 300 calculated voltage changes. The legend to the right of the plot 700 shows that the voltage changes are within a range of 1.5 and −1.5.

FIG. 8 shows a plot 800 of the data from the plot 700 after it has been smoothed over time. The smoothing has a result of minimizing voltage changes. The legend to the right of plot 800 shows that the voltage changes are within a range of 0.6 and −0.6.

FIG. 9 shows a plot 900 illustrating the result of filtering the data of plot 700 for run lengths (i.e., sequences of the same data repeated). The data in the plot 900 has been segmented by row and phase. The plot reflects a determination if the absolute average value of each segment is above a threshold.

The plot 900 may be computed by the following algorithm expressed as pseudo-code:

```
For each time sample t in 1 to N
For each phase P in A, B, C
    Compute average value of voltage changes at t for the transformers in P
    If the abs of the average value > threshold T
        Set the voltage changes at t for P to the average value
    Otherwise
        Set the voltage changes at t for P to 0.
```

Figure 10:
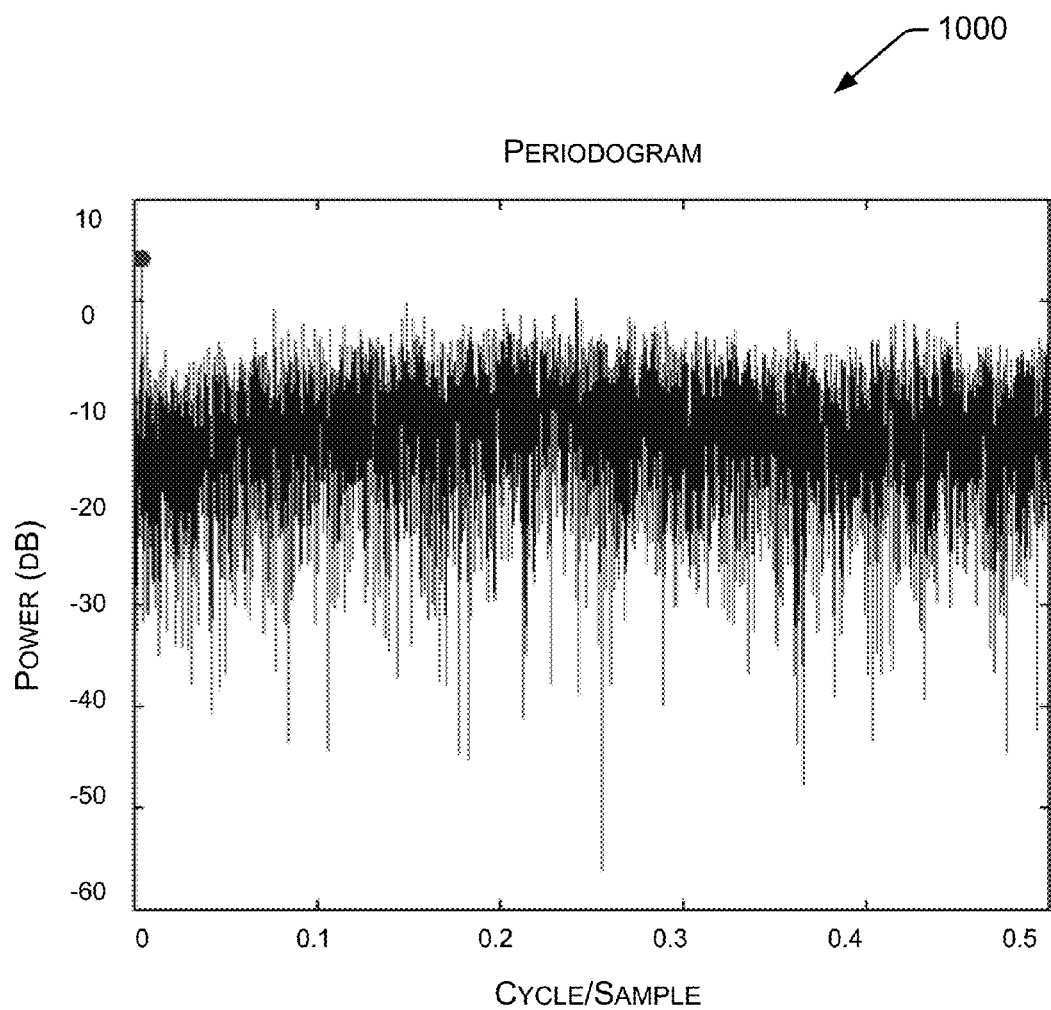
FIG. 10 is a periodogram of the power spectral density of a selected filtered transformer centroid.

The periodogram of FIG. 10 shows a computation 1000 of the power spectral density of a selected filtered transformer centroid. The transformer provides power to a plurality of meters, and is associated with voltage, current and power measurements, made by those meters.

Figure 11:
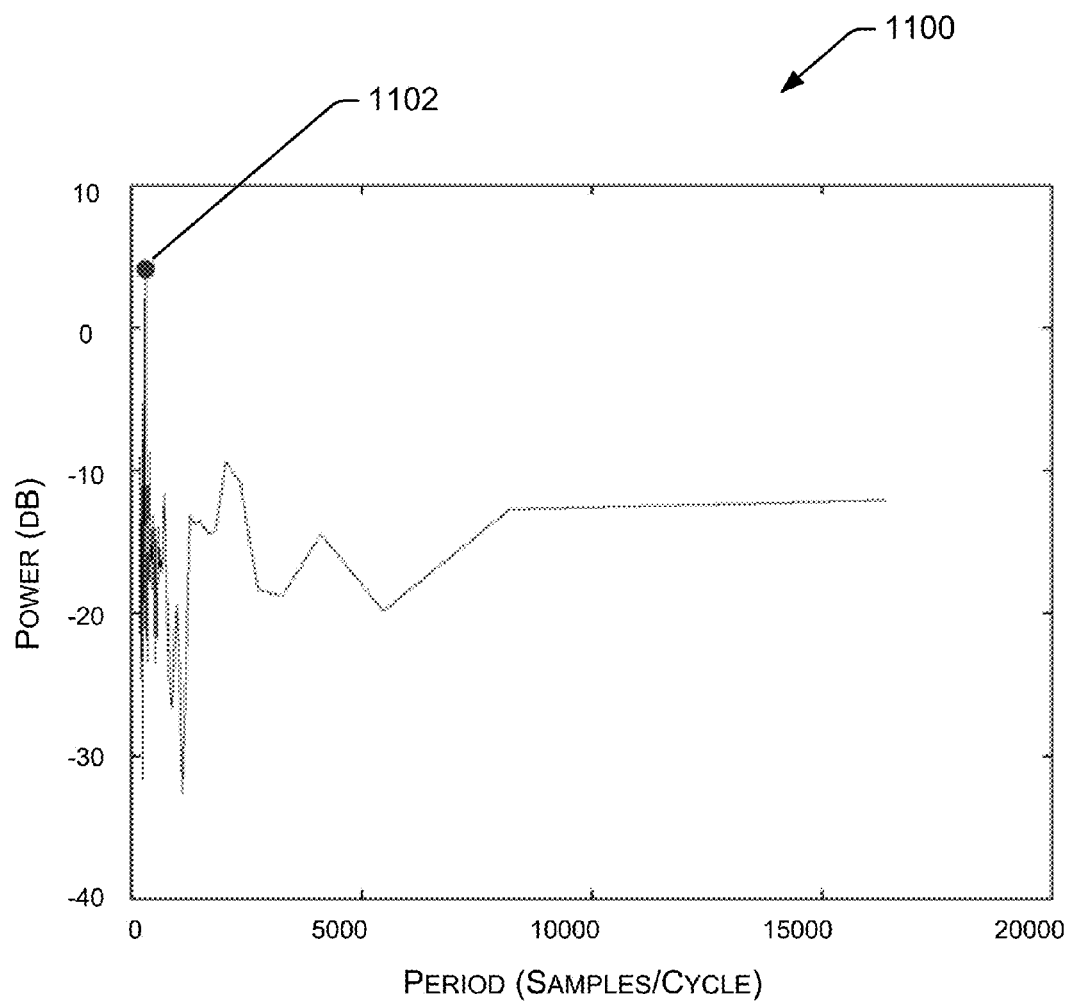
FIG. 11 is a graph configured to show samples per cycle of the selected filtered transformer centroid.

FIG. 11 shows a graph 1100 organized by samples per cycle. In the plot, the horizontal axis shows inverse frequency, i.e., 1/f.

The graph 1100 is marked with a period 1102 of max power, which equals 287.43 samples/cycle. The equation:

287.43/12 samples per hour=23.95 hours, may be used to derive a period, which is approximately 24 hours. Accordingly, the dominant frequency of voltage changes within the graph 1100 occurs in 24-hour periods. Accordingly, the algorithm may utilize daily voltage corrections performed at the substation. This is supportive of the use of voltage measurements (and voltage change data) at 60-minute intervals and over two days.

Figure 12:
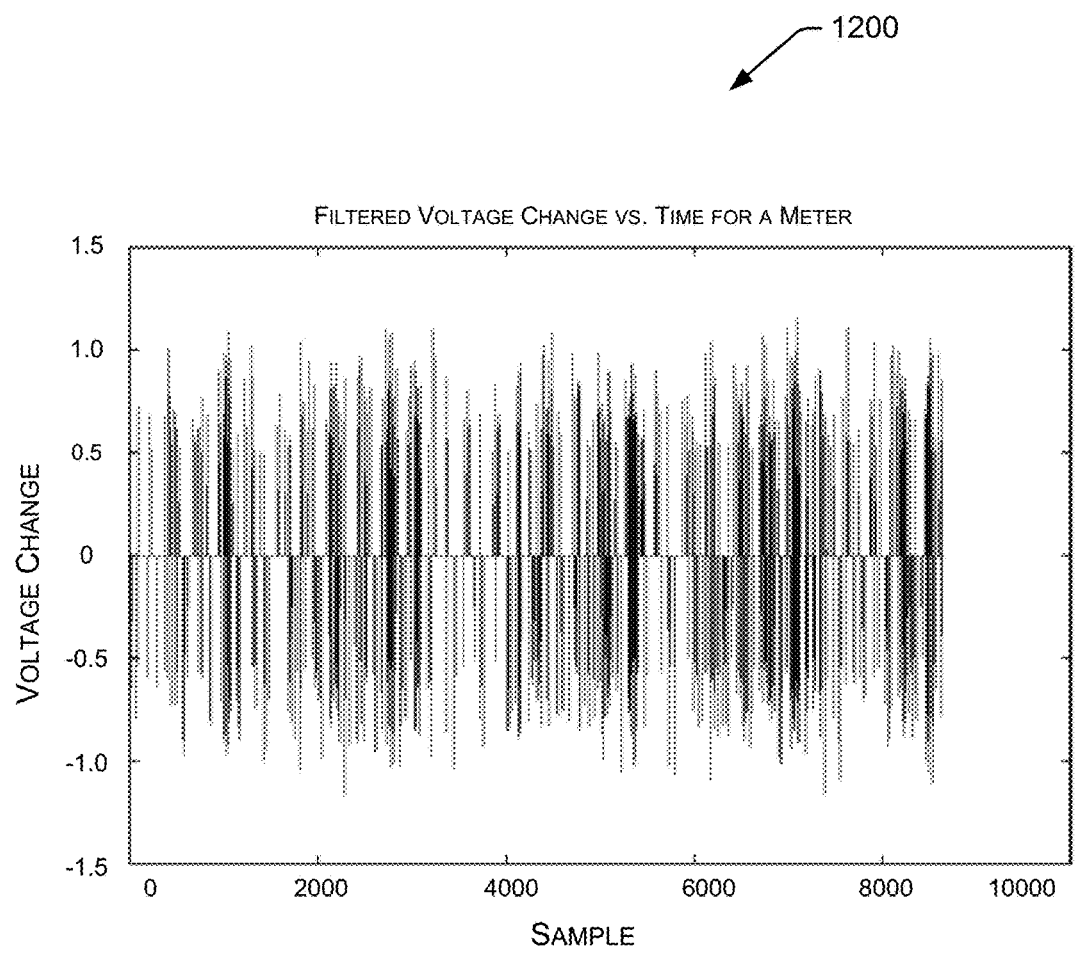
FIGS. 12 and 13 are views of two plots of data associated with an individual transformer centroid vs. time.
Figure 13:
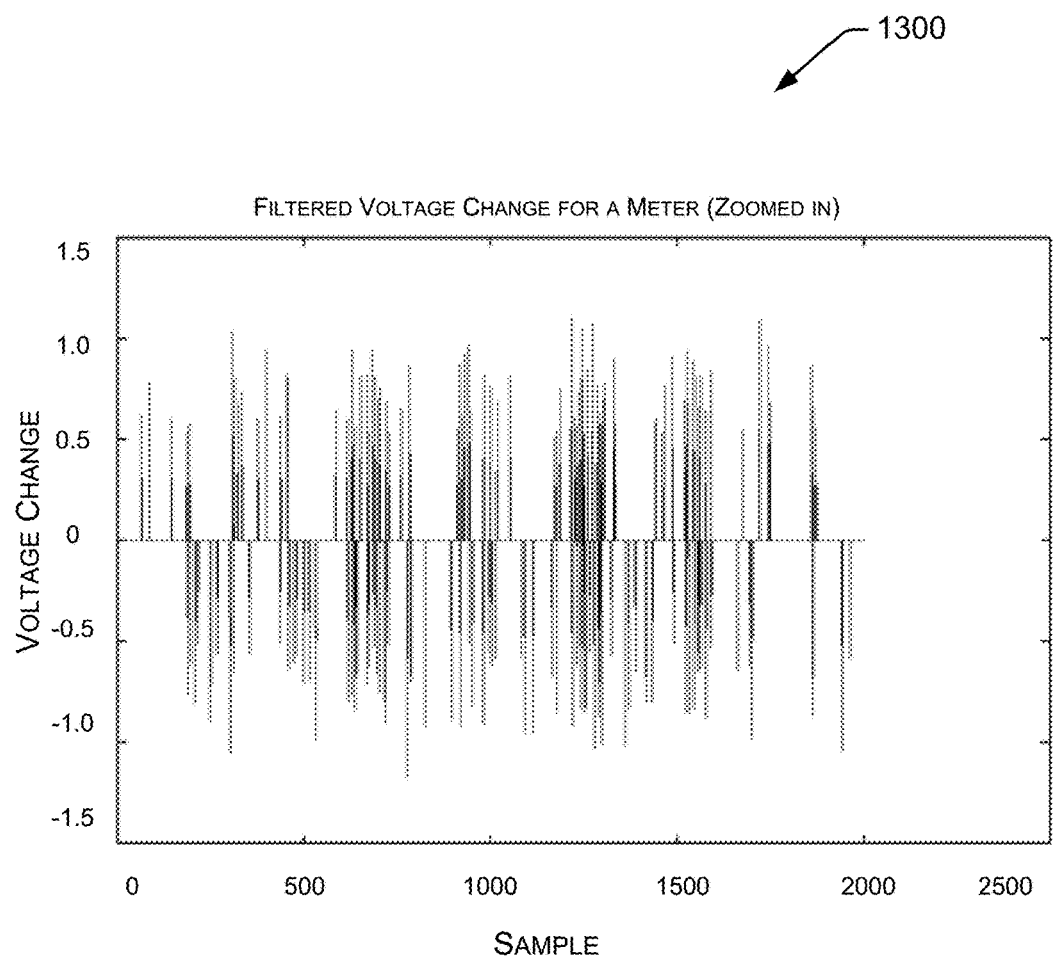

FIGS. 12 and 13 show views of two plots of data associated with an individual transformer centroid vs. time. The view 1200 of FIG. 12 shows 10,000 samples, while the view 1300 of FIG. 13 shows 2500 samples and is therefore a "zoomed" view of the data of portions of the data 1200.

Example Computing System for Grid Topology and Phase Discovery

Figure 14:
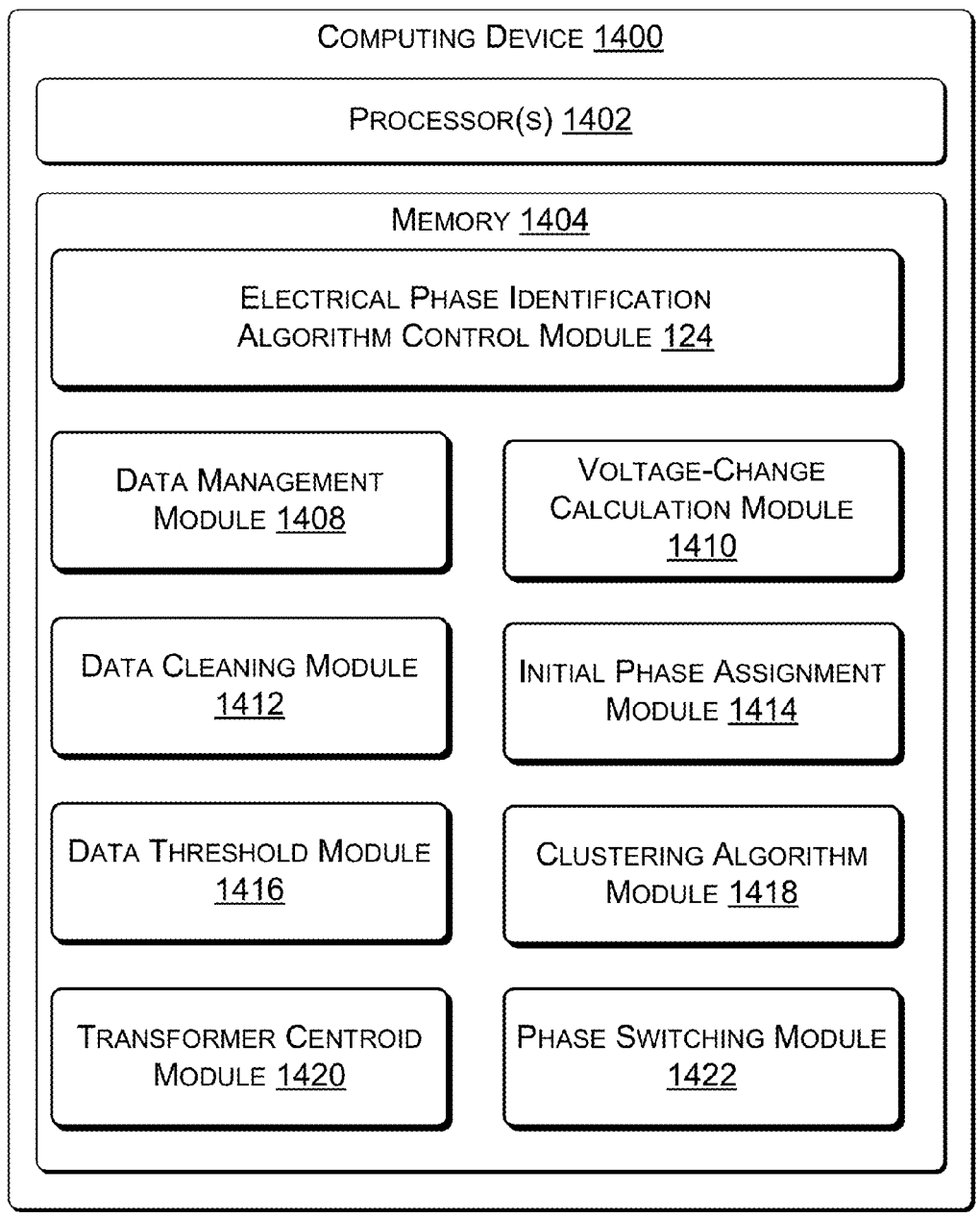
FIG. 14 is a block diagram showing an example structure of a computing device configured to identify aspects of network topology including electrical phase use by network components.

FIG. 14 is a block diagram showing an example structure of a computing device 1400 configured to identify aspects of network topology including electrical phase use by individual network components (e.g., transformers and electrical meters). In one example, the computing device 1400 is located within the central office 102. In other examples, the computing device is located in alternative locations. In the example shown, the computing device 1400 is monolithic in design. However, in other examples, elements of the computing device 1400 and/or its functionality may be distributed over two or more devices.

A processor 1402 may be in communication with memory 1404. The processor 1402 may include one or more processors, which may be general purpose or specifically purposed, such as application specific integrated circuits (ASICs). The memory 1404 may include one or more modules, which may be configured as processor-executable instructions such as subroutines, procedures and/or functions, etc. Software functionality is represented for purposes of illustration as residing in several "modules," which are intended only to represent a single possible organization of executable statements, among a number of alternative designs. Accordingly, while example modules are shown, the segregation of particular functional aspects into particular modules is for purposes of example and discussion only. Further, other, different and/or alternative arrangements involving different modules and/or different groupings of functional elements within the same or different modules may be used when indicated by particular design requirements.

The electrical phase identification algorithm control module 124 may comprise one or more sections of computer executable statements that control the execution of other statements, such as the various modules 1408-1422. Accordingly, the algorithm control module may be used to provide overall management of techniques that determine the topology of an electrical grid, particularly with respect to an electrical phase used by network devices (transformers, meters, etc.) and particularly by use of voltage and voltage-change data.

A data management module 1408 may comprise one or more sections of computer executable statements that request, receive, store and otherwise manage incoming voltage and/or voltage-change data. The data management module 1408 may receive voltage data from metrology components of an electric meter, and may receive voltage-change data from the voltage change calculation module 1410. The data management module 1408 may manage and maintain data structures as needed to manage the data.

A voltage-change calculation module 1410 may comprise one or more sections of computer executable statements that calculate voltage changes at one or more meters based on incoming voltage measurement data. In the example above, the voltage change data may be in any format or data structure, such as the vectors:

$\bar{d}_i = [d_i^0, \ldots, d_i^{T-2}]$, a voltage change (or voltage difference) vector for a meter $m_i$, where $d_i^j = v_i^{j+1} - v_i^j$, $j=0, \ldots, T-2$, and shows the calculation of each voltage change (or difference).

A data cleaning module 1412, may comprise one or more sections of computer executable statements that process data (i.e., "clean" the data). As described by the example of block 302 of FIG. 3, incomplete voltage data obtained from one or more meters or other sources may be purged. Generally, the incomplete data is not useful, and may result in errors or degraded output.

An initial phase assignment module 1414 may comprise one or more sections of computer executable statements that assign network devices (e.g. electrical meters or transformers) to a group or cluster associated with a particular electrical phase. Such groupings may be used as a classification that is a starting point or input to a clustering algorithm. In one example, the initial phase assignment module 1414 may perform as described by block 204 in FIG. 2. Accordingly, the initial phase assignment may provide an initial classification and may be made according to an outdated record, a best guess or a random assignment.

A data threshold module 1416 may comprise one or more sections of computer executable statements that limit data values to a threshold value. Such "thresholding" may be performed on data to achieve better results from clustering techniques, such as k-means. In on example, the data threshold module 1416 may perform the functions of block 202 in FIG. 2.

A clustering algorithm module 1418 may comprise one or more sections of computer executable statements that perform a clustering function. The clustering function may be k-means or another appropriately selected technology. In operation, clustering function may include the techniques described with respect to block 206 of FIG. 2.

A transformer centroid module 1420 may comprise one or more sections of computer executable statements useful in determining the electrical phase to which a transformer is attached. Data gathered from a transformer's plurality of meters may be used to determine a centroid for the transformer, and a variation of the algorithm discussed at FIG. 2 may be applied.

A phase switching module 1422 may comprise one or more sections of computer executable statements that direct the actual disconnection of one or more transformers and/or meters from one phase (e.g., of a primary conductor) and reconnection of those network devices onto a different phase of the electrical network. The direction may include an email or other message sent to an appropriate dispatcher or work crew. By moving the network device from one phase to the other, the overall load of the system may become better balanced, efficient and/or cost-effective.

Example Methods

In some examples of the techniques discusses herein, the methods of operation may be performed by one or more application specific integrated circuits (ASIC) or may be performed by a general purpose processor utilizing software defined in computer readable media. In the examples and techniques discussed herein, the memory 1404 may comprise computer-readable media and may take the form of volatile memory, such as random access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals.

Figure 15:
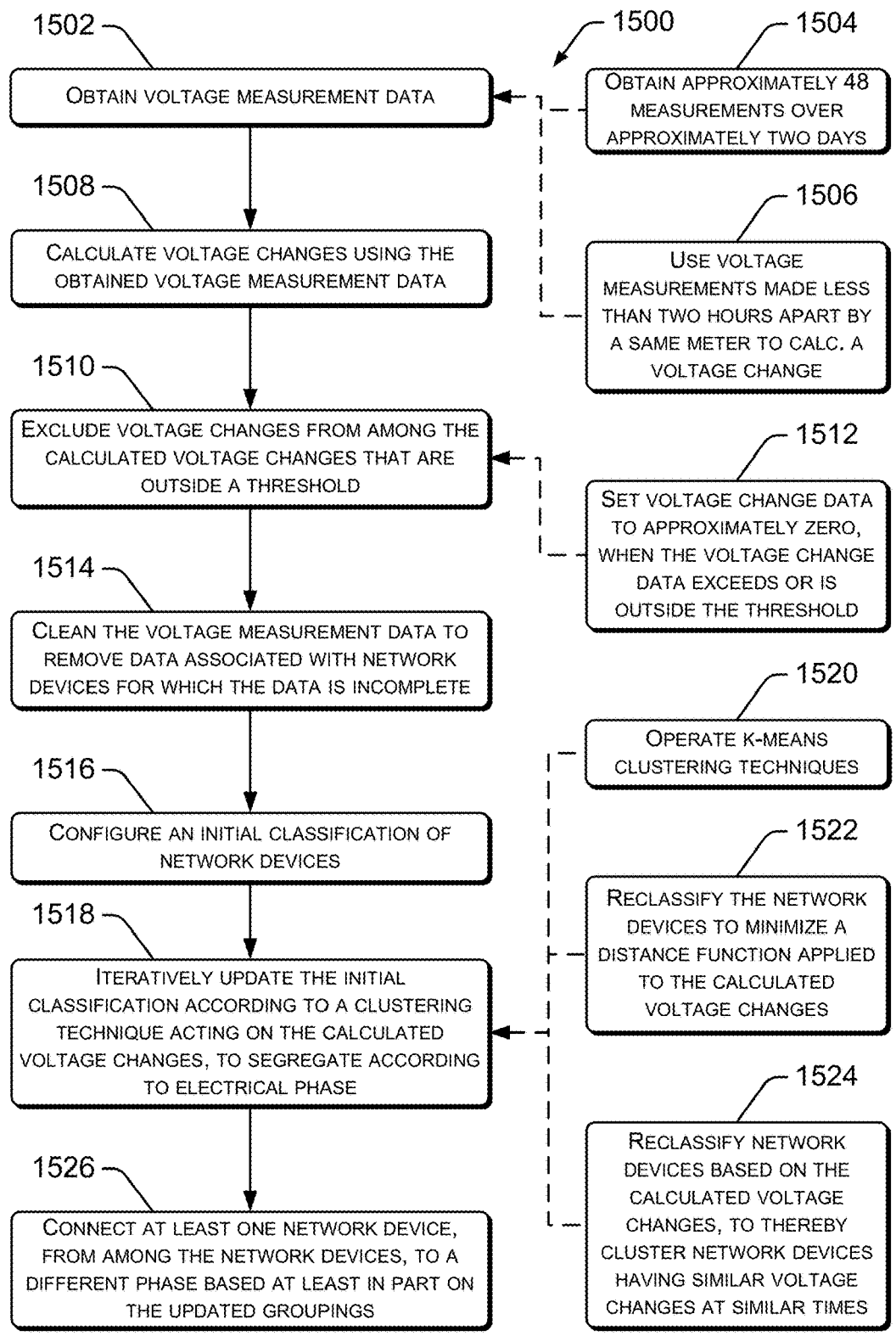
FIG. 15 is a flowchart showing an example method by which aspects of network topology including electrical phase may be determined.
Figure 16:
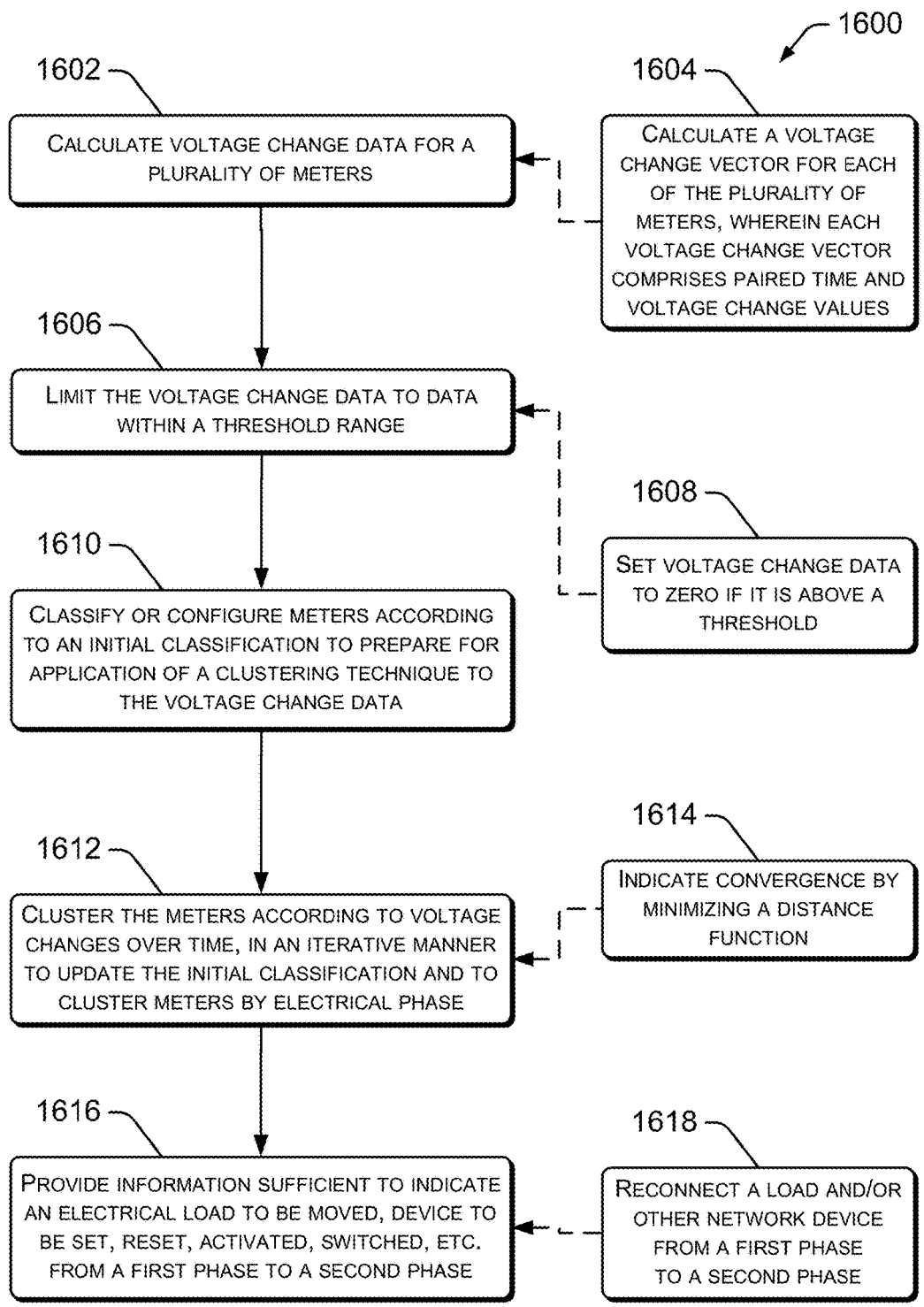
FIG. 16 is a flowchart showing a further example method by which aspects of network topology including electrical phase may be determined.

FIGS. 15 and 16 are flow diagrams showing example processes which are representative of techniques that identify an electrical phase used by network components (e.g., network devices, meters, etc.), such as by analysis of voltage and/or voltage change data. The processes may, but need not necessarily, be implemented in whole or in part by the central office 102 and/or the computing device 1400.

FIG. 15 is a flow diagram showing an example method 1500 by which aspects of network topology, including electrical phase use by individual network components, may be determined. The phase used by a meter or transformer (or other network device) may be determined at least in part by voltage measurements and/or voltage-change calculations. At block 1502, voltage measurement data may be obtained, such as from one or more electrical meters. The voltage measurements may be made at regular intervals, such as 5-minute or 60-minute intervals, or irregular intervals. The voltage measurement data may be obtained over a period of time, typically two days or more. The voltage measurement data may be obtained by operation of software or hardware, such as by operation of the data management module 1408 seen in FIG. 14. The voltage data may be obtained by an electric meter, a server in the central office, or by a computing device otherwise located in a smart grid network. In the example of block 1504, approximately 48 measurements are obtained over approximately two days in one-hour intervals. Alternatively, approximately 500 measurements may be made over approximately two days in five-minute intervals. In the further example of block 1506, voltage measurements, made less than two hours apart by a same meter, are used to calculate a voltage change.

At block 1508, voltage changes are calculated using the obtained voltage measurement data associated with a meter or other network device. In one example, a previous voltage measurement is subtracted from a current voltage measurement, thereby obtaining a voltage change or voltage difference. This may be performed by the voltage-change calculation module 1410 or by other software or hardware device located on an electric meter, a server in the central office, or a computing device within the electrical network. Each voltage change data element may be associated with a time of measurement. The data may be assembled into a data change vector, indicting data change values over time.

At block 1510, voltage change data may be excluded (i.e., removed, filtered, purged and/or erased, etc.) from among the calculated voltage changes according to a threshold. As discussed with respect to the data threshold module 1416 and block 202 of FIG. 2, larger voltage changes are not always compatible with clustering techniques like k-means. Accordingly, voltage change data having a magnitude over a threshold value may be removed. In the example of block 1512, voltage change data may be set to approximately zero, when the voltage change data exceeds the threshold. This may promote better results from a k-means algorithm.

At block 1514, "data cleaning" may be performed to remove unwanted data. In one example, a cleaning process may remove voltage measurement data associated with network devices for which the data is incomplete or of suspected accuracy. Thus, for a particular meter, if only 21 of 48 desired voltage measurements are available, all may be erased, removed or otherwise excluded from consideration.

At block 1516, an initial classification of network devices may be configured. As discussed with respect to the initial phase assignment module 1414, the assignment may utilize the best information available about which network devices are connected to which electrical phases. Alternatively, the initial classification may be made randomly.

At block 1518, the initial classification may be iteratively updated according to a clustering technique acting on the calculated voltage changes (typically having outlier data removed according to the threshold). In operation, the iterative updates segregates the network devices according to electrical phase. In the example of block 1520, the clustering technique utilizes k-means technology. In the example of block 1522, the network devices are reclassified to minimize a distance function. In the example of block 1524, at least some network devices are reclassified based on the calculated voltage changes, to thereby cluster network devices having similar calculated voltage changes at similar times.

At block 1526, at least one network device, from among the network devices, is connected to a different phase based at least in part on the updated groupings. This may increase electrical grid transmission efficiency, increase useful life of components on the electrical grid, and promote safety.

FIG. 16 is a flow diagram showing an example method 1600 by which aspects of network topology, including electrical phase use by individual network components, may be determined. The phase used by a meter or transformer may be determined at least in part by voltage measurements and/or voltage-change calculations. At block 1602, voltage change data is calculated for a plurality of meters. In the example of block 1604, a voltage change vector is calculated for each of the plurality of meters. In the example, each voltage change vector includes paired time and voltage change values. At block 1606, the voltage change data may be limited, such as by use of a threshold. In the example of block 1608, voltage change data may be set to zero (or a reduced value) if it is above a threshold. At block 1610, meters may be configured into an initial classification in preparation for operation of a clustering technique applied to the voltage change data. At block 1612, the meters may be clustered according to voltage changes in time. The clustering process (e.g., k-means) may be performed in an iterative manner. Each iteration updates the classification of the previous iteration, until a stopping condition (e.g., no further movement between groups in the classification) is met. At this point, the meters have been clustered into groups that indicate the electrical phase of each meter. In the example of block 1614, the iterative process may be one in which convergence is indicated by minimizing a distance function. At block 1616, information about an electrical service associated with at least one meter from among the plurality of meters may be provided, such as to a head office, work-crew dispatch, or other location. The information provided to the office or work crew should be sufficient to indicate an electrical load (e.g., a customer's electrical service) to be moved from one phase to another phase. In the example of block 1618, a load is moved from a first phase and reconnected to a second phase. The load may previously have been thought to be on a particular electrical phase, until it was revealed that is was on a different phase. Alternatively, the load may have been placed on a phase assumed to be under-utilized that is later found to be over-utilized. Moving the load to a different phase may balance the network and increase transmission efficiency, increase safety and/or increase the service life of network components.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
    under control of one or more processors configured with executable instructions:
    obtaining voltage measurement data, wherein the voltage measurement data comprises voltage measurements made at a plurality of meters, wherein each meter is connected to a transformer, and wherein each transformer is connected to a phase of a feeder line;
    calculating voltage change data for each meter using the obtained voltage measurement data, wherein the calculated voltage change data of each meter is based at least in part changing voltages of a phase of the feeder line to which the meter is connected, and wherein voltage measurements are made less than two hours apart by a same network device to calculate a voltage change;
    excluding voltage change data having a magnitude greater than a threshold value;
    configuring an initial classification of network devices; and
    updating the initial classification according to a clustering technique acting on the calculated voltage change data, thereby segregating the network devices according to electrical phase, wherein the updating of the initial classification is based at least in part on:
        the calculated voltage change data of each meter;
        connectivity of meters to a respective transformer; and
        connectivity of each transformer to a phase of the feeder line.

2. The method of claim 1, wherein the updating comprises:
    reclassifying at least some network devices based on the calculated voltage change data, to thereby cluster network devices having similar calculated voltage changes at similar times.

3. The method of claim 1, wherein the updating comprises:
    reclassifying the network devices to minimize a distance function as applied to the calculated voltage change data.

4. The method of claim 1, wherein the updating comprises:
    operating k-means clustering techniques to segregate the network devices according to electrical phase.

5. The method of claim 1, wherein obtaining voltage measurement data comprises:
    obtaining at least 48 measurements over at least two days.

6. The method of claim 1, wherein excluding of the voltage change data comprises:
    setting voltage change data to approximately zero, when the magnitude of the voltage change data exceeds the threshold value.

7. The method of claim 1, additionally comprising:
connecting at least one network device, from among the network devices, to a different phase based at least in part on the update.

8. The method of claim 1, additionally comprising:
excluding data from network devices for which insufficient or incomplete data exists.

9. One or more computer-readable media storing computer-executable instructions that, when executed, cause one or more processors to perform acts comprising:
obtaining voltage measurement data, wherein the voltage measurement data comprises voltage measurements made at a plurality of network devices, wherein each network device is connected to a transformer, and wherein each transformer is connected to a phase of a feeder line;
calculating voltage change data for a plurality of network devices, wherein the calculated voltage change data of each of the plurality of network devices is based at least in part changing voltages of a phase of the feeder line to which the network device is connected, wherein calculating the voltage change data comprises calculating a voltage change vector for each of the plurality of network devices, and wherein each voltage change vector comprises paired time and voltage change values;
classifying meters according to an initial classification to prepare for application of a clustering technique to the voltage change data;
clustering the meters according to voltage changes over time, in an iterative manner to update the initial classification and to thereby cluster meters by electrical phase; and
providing information about an electrical service associated with at least one network device from among the plurality of network devices, the information sufficient to indicate an electrical load to be moved from a first phase to a second phase.

10. One or more computer-readable media as recited in claim 9, wherein the acts additionally comprise:
setting to zero voltage change data having a magnitude greater than a threshold value.

11. One or more computer-readable media as recited in claim 9, wherein clustering the meters comprises:
minimizing a distance function between the meters.

12. One or more computer-readable media as recited in claim 9, wherein providing information comprises:
reconnecting a load measured by a first network device from a first phase to a second phase.

13. A computing device, comprising:
a processing unit;
memory, accessible by the processing unit;
a data module, defined in the memory and executed by the processing unit, to gather voltage measurement data of a plurality of network devices, wherein the voltage measurement data comprises voltage measurements made at a plurality of network devices, wherein each network device is connected to a transformer, and wherein each transformer is connected to a phase of a feeder line;
a voltage change calculation module, defined in the memory and executed by the processing unit, to calculate voltage change data for each of the plurality of network devices, wherein the calculated voltage change data of each of the plurality of network devices is based at least in part changing voltages of a phase of the feeder line to which the network device is connected, wherein calculating the voltage change data comprises calculating a voltage change vector for each of the plurality of network devices, and wherein each voltage change vector comprises paired time and voltage change values; and
a clustering module, defined in the memory and executed by the processing unit, to determine a phase to which a network device from among the plurality of network devices is associated based at least in part on the changes in voltage determined by the voltage change calculation module, wherein the clustering module is configured to utilize k-means techniques to cluster network devices having similar calculated voltage changes at similar times.

14. The computing device as recited in claim 13, additionally comprising:
a phase-switching module, defined in the memory and executed by the processing unit, and configured to cause a load of one of the plurality of network devices to be switched from one phase to another phase.

15. The computing device as recited in claim 13, wherein the data module is configured to:
obtain data over a period of at least 24 hours; and
obtain measurements separated by 2 hours or less.

16. The computing device as recited in claim 13, additionally comprising:
a data threshold module configured to set voltage change data to approximately zero, when the voltage change data exceeds a threshold; and
a data cleaning module configured to remove voltage data associated with network devices for which the gathered voltage measurement data is incomplete.

17. The computing device as recited in claim 13, wherein the clustering module is configured to perform:
an iterative process by which convergence is indicated by minimizing a distance function.

* * * * *